(12) United States Patent
Choi

(10) Patent No.: US 8,009,476 B2
(45) Date of Patent: Aug. 30, 2011

(54) SEMICONDUCTOR MEMORY DEVICE USING VARIABLE RESISTOR

(75) Inventor: Byung-Gil Choi, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 118 days.

(21) Appl. No.: 12/622,536

(22) Filed: Nov. 20, 2009

(65) Prior Publication Data

US 2010/0067279 A1   Mar. 18, 2010

Related U.S. Application Data

(63) Continuation-in-part of application No. 11/750,487, filed on May 18, 2007, now Pat. No. 7,643,344.

(30) Foreign Application Priority Data

Sep. 19, 2006   (KR) .............................. 2006-0090507

(51) Int. Cl.
    *G11C 16/04*   (2006.01)
(52) U.S. Cl. .................... 365/185.13; 365/148; 365/158; 365/163; 365/230.03

(58) Field of Classification Search ................ 365/46, 365/100, 148, 163, 158, 171, 173, 185.13, 365/185.23, 185.25, 210.13, 230.03
See application file for complete search history.

(56) References Cited

U.S. PATENT DOCUMENTS 6,456,521 B1 * 9/2002 Hsu et al. ..................... 365/149
6,493,284 B2 * 12/2002 Kim .......................... 365/230.06
7,016,214 B2 * 3/2006 Kawamata et al. ............. 365/63

* cited by examiner

*Primary Examiner* — Richard Elms
*Assistant Examiner* — Harry W Byrne
(74) *Attorney, Agent, or Firm* — F.Chau & Associates, LLC

(57) ABSTRACT

Example embodiments relate to a variable resistance semiconductor memory device including: a plurality of memory blocks belonging to different memory sectors and alternately arranged in a memory bank including the memory sectors so as to be adjacent to each other; and a line selecting unit simultaneously selecting word lines of the plurality of memory blocks and simultaneously selecting bit lines of the memory blocks belonging to the same memory sector among the plurality of memory blocks in an access operation mode.

10 Claims, 9 Drawing Sheets

SEMICONDUCTOR MEMORY DEVICE USING VARIABLE RESISTOR

CROSS-REFERENCE TO RELATED APPLICATIONS

This application is a continuation-in-part application of U.S. patent application Ser. No. 11/750,487, filed on May 18, 2007 now U.S. Pat. No. 7,643,344, and entitled VARIABLE RESISTIVE MEMORY, the disclosure of which is incorporated herein by reference in its entirety, and which, in turn, claims foreign priority under 35 U.S.C. §119 to Korean Patent Application No. 2006-0090507, filed on Sep. 19, 2006, in the Korean Intellectual Property Office, the disclosure of which is incorporated herein by reference in its entirety.

BACKGROUND

1. Field

Example embodiments of the present invention relate to a semiconductor memory device, and more particularly, to a technique for reducing a word line current in a semiconductor memory device using a variable resistor as a unit memory cell.

2. Description of the Related Art

The next-generation non-volatile memory devices without a refresh operation have been developed in order to increase memory capacity and reduce power consumption. In recent years, for example, the following next-generation memory devices have drawn attention: a phase change random access memory (PRAM) using a phase change material; a resistive random access memory (RRAM) using a material having variable resistance characteristics such as a transition metal oxide; and a magnetic random access memory (MRAM) using a ferromagnetic material. The materials forming the next-generation memory devices are common in that their resistance values vary depending on a current or a voltage and they do not require a refresh operation due to their non-volatile characteristics in which the resistance value is maintained after the supply of the current or voltage is cut off.

In the next-generation memory device, during a write operation, when a large amount of write current flowing through a plurality of memory cells flows to one word line, a word line voltage is increased. In addition, during a read operation, when a read current is supplied to one word line through a plurality of memory cells, a word line voltage is increased. As a result, a desired amount of write current or a desired amount of read current does not flow, which results in an error in the write or read operation.

Therefore, measures to prevent an increase in word line voltage during a data access operation are required.

SUMMARY

Example embodiments of the invention provide a semiconductor memory device capable of minimizing an increase in word line voltage during a write or read operation.

Example embodiments of the invention also provide a semiconductor memory device using a variable resistor capable of minimizing or reducing the amount of current flowing to an activated word line.

Example embodiments of the invention also provide a variable resistance semiconductor memory device capable of stably performing a write or read operation.

According to example embodiments, a variable resistance semiconductor memory device includes: a plurality of memory blocks belonging to different memory sectors and alternately arranged in a memory bank including the memory sectors so as to be adjacent to each other; and a line selecting unit simultaneously selecting word lines of the plurality of memory blocks and simultaneously selecting bit lines of the memory blocks belonging to the same memory sector among the plurality of memory blocks in an access operation mode.

According to example embodiments, a variable resistance semiconductor memory device includes: first group memory blocks belonging to a first memory sector of a memory bank and arranged with a gap therebetween; second group memory blocks belonging to a second memory sector of the memory bank and arranged between the first group memory blocks; and a line selecting unit simultaneously activating word lines of the first and second group memory blocks and simultaneously activating bit lines of the first group memory blocks or the second group memory blocks in an access operation mode.

The word line may be a sub word line connected to a main word line. The bit line may be a local bit line connected to a global bit line.

The first and second group memory blocks may be arranged in each of two sectors. Each of the memory blocks may include a memory cell having a variable resistor in a region in which the sub word line and the local bit line intersect each other.

The line selecting unit may include: a main word line driver activating one main word line in each of the first and second memory sectors in response to a main word line selection signal; sub word line drivers provided between the memory blocks and activating the sub word lines of the memory blocks in response to the activated main word line signal; a local bit line selection signal generating unit generating local bit line selection signals in response to a memory sector selection signal; and local bit line selecting units allocated to each of the memory blocks and connecting the local bit lines of the memory blocks to the corresponding global bit lines in response to the local bit line selection signals.

The first and second memory sectors may be symmetrically arranged with respect to the main word line driver or the local bit line selecting unit.

According to example embodiments, a variable resistance semiconductor memory device includes: first group memory blocks belonging to a first memory sector of a memory bank and including sub memory blocks that are arranged with a gap therebetween; second group memory blocks belonging to a second memory sector of the memory bank and arranged between the sub memory blocks of the first group memory blocks; and a line selecting unit simultaneously activating word lines of the first and second group memory blocks and simultaneously activating bit lines of the first group memory blocks or the second group memory blocks in an access operation mode.

The first and second memory sectors may be symmetrically arranged with respect to a main word line driver or a local bit line selecting unit As described above, according to the above-mentioned example embodiments in which the memory blocks belonging to different sectors are alternately arranged, it is possible to minimize the amount of current flowing to an activated word line in the memory sector and thus prevent an increase in word line voltage. Therefore, it is possible to stably perform a write or read operation.

BRIEF DESCRIPTION OF THE DRAWINGS

The above and other features and advantages will become more apparent by describing in detail example embodiments thereof with reference to the attached drawings in which.

DETAILED DESCRIPTION

Figure 1:
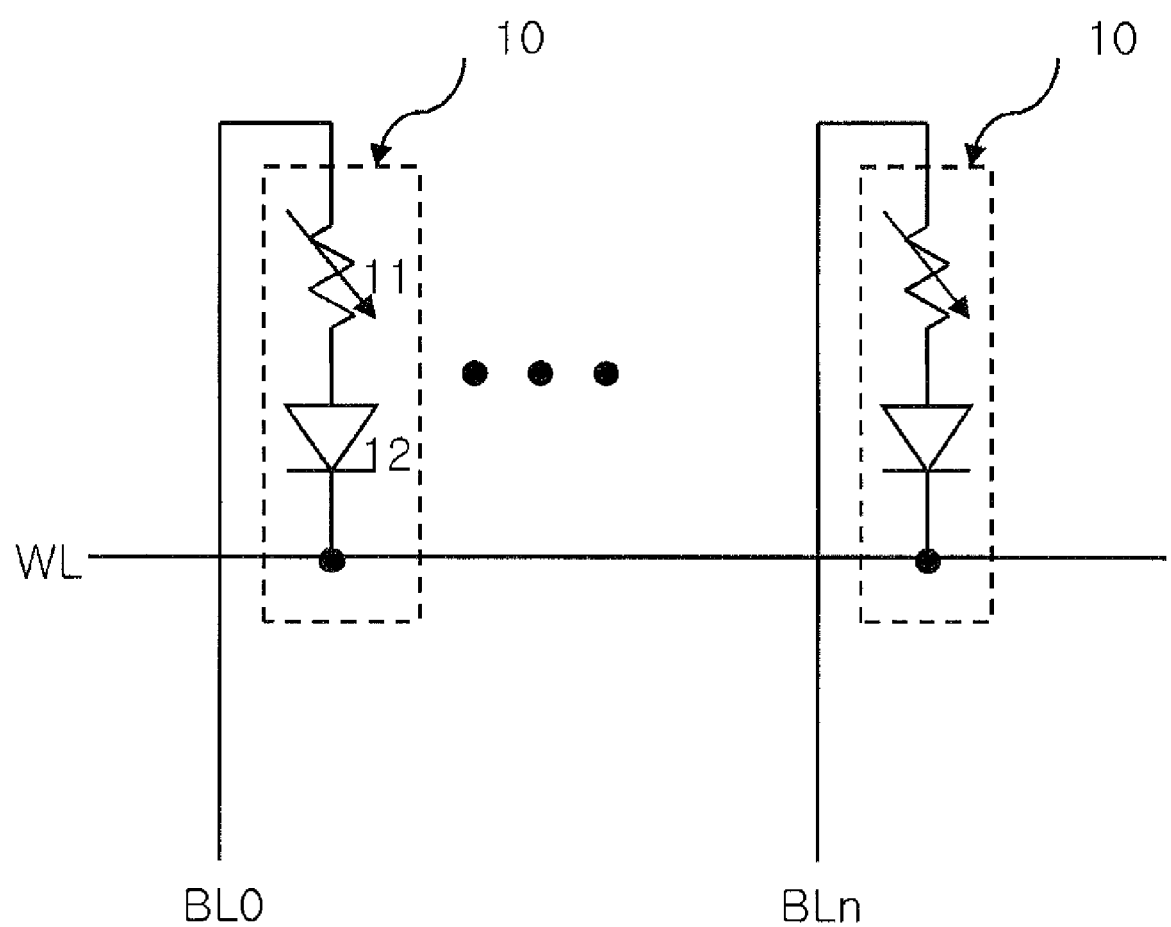
FIG. 1 is a diagram illustrating unit memory cells each having a general variable resistor.

Example embodiments will now be described more fully with reference to the accompanying drawings. In the drawings, the thicknesses of layers and regions may be exaggerated for clarity.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second and third may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, semiconductor memory devices capable of minimizing the amount of current flowing to an activated word line and preventing an increase in word line voltage according to example embodiments of the invention will be described with reference to the accompanying drawings.

Figure 4:
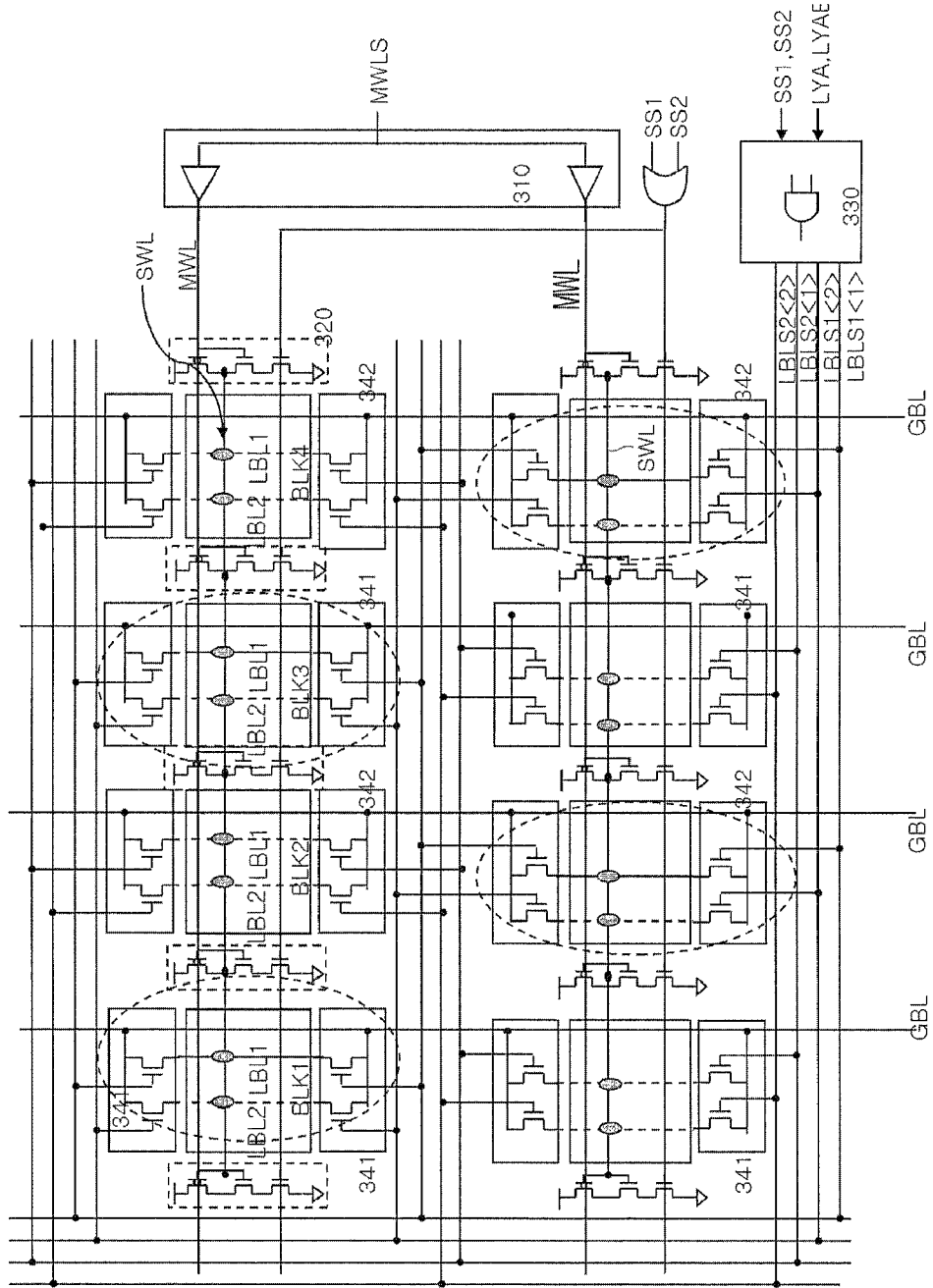
FIG. 4 is a detailed circuit diagram illustrating the memory device shown in FIG. 3.
Figure 5:
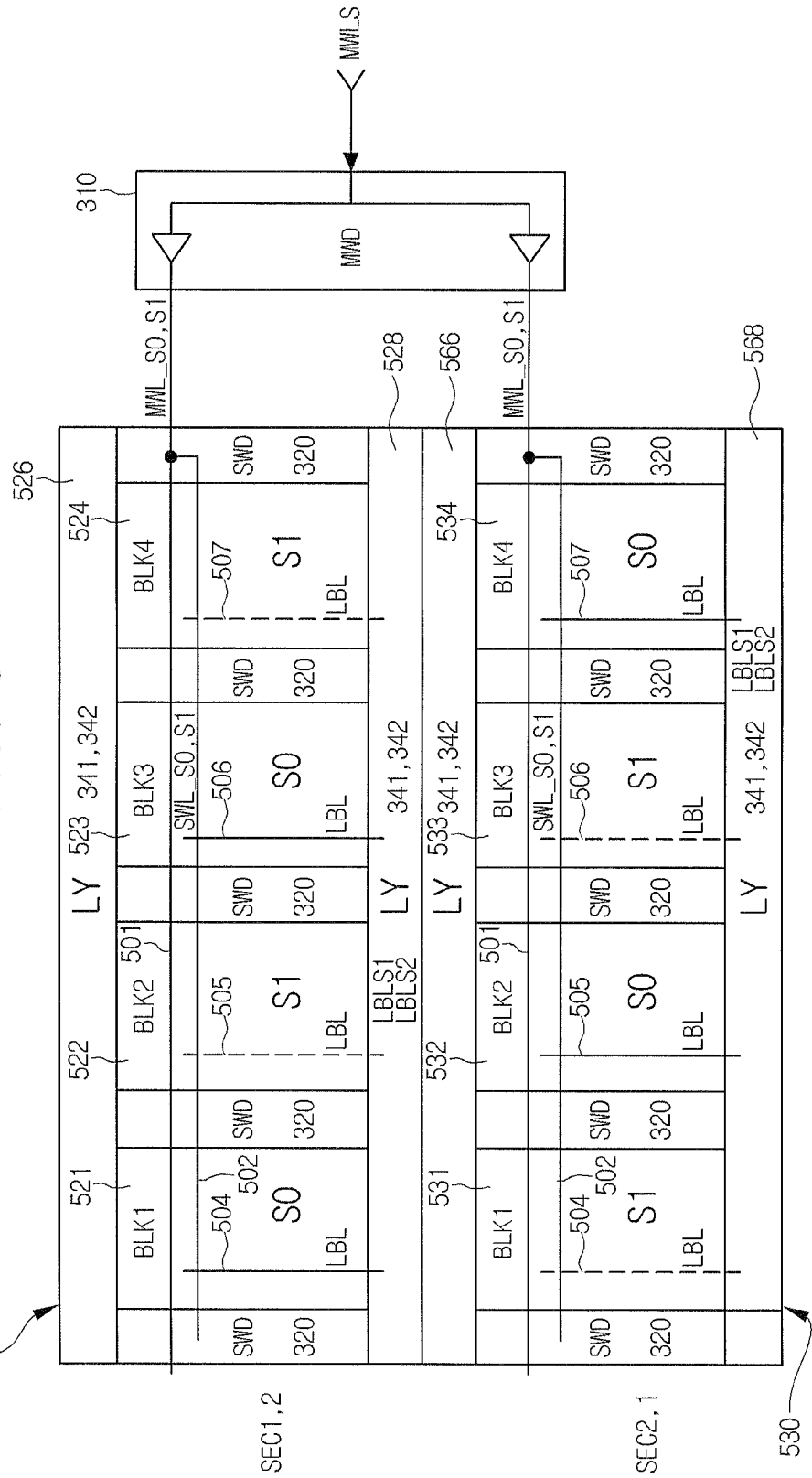
FIG. 5 is a block diagram schematically illustrating a memory device having a vertical alternating block arrangement structure according to an example embodiment of the invention.

Before an improved memory device shown in FIG. 5 is described, the cause of an increase in word line voltage and a scheme for preventing the increase in word line voltage will be described in detail with reference to FIGS. 1 to 4 only for ease of understanding of the following embodiments of the invention.

First, FIG. 1 shows unit memory cells each including a general variable resistor. Referring to FIG. 1, a memory cell 10 includes a variable resistor 11 and a switching element 12. The variable resistor 11 is connected between a bit line BL and the switching element 12, and the switching element 12 is connected to the variable resistor 11 and a word line WL.

The memory cell 10 shown in FIG. 1 may form memory devices, such as a PRAM, an RRAM, and an MRAM, according to the type of variable resistor 11. When the variable resistor 11 is made of a phase change material (GST (Ge—Sb—Te)) and the resistance thereof varies depending on the temperature, the memory cell may be a PRAM. When the variable resistor 11 includes an upper electrode, a lower electrode, and a transition metal oxide (complex metal oxide) interposed therebetween, the memory cell may be an RRAM. When the variable resistor 11 includes upper and lower magnetic electrodes and an insulator interposed therebetween, the memory cell may be an MRAM.

For convenience of explanation, it is assumed that the variable resistor is made of a phase change material. However, the technical spirit of the invention may be applied to the RRAM and the MRAM.

The switching element 12 is a diode and has both ends connected to the variable resistor 11 and the word line WL. The switching element 12 may be an NMOS transistor instead of the diode. In this case, the gate of the NMOS transistor is connected to the word line WL, and the drain and source thereof are connected to the variable resistor 11 and a reference voltage, respectively. In FIG. 1, the variable resistor 11 is connected between the bit line BL and the switching element 12. However, the switching element 12 may be connected between the bit line BL and the variable resistor 11.

For example, U.S. Pat. Nos. 6,487,113, 6,570,784, and 6,667,900 disclose the write and read operations of the unit memory cell 10.

When data 1 is stored in the unit memory cell shown in FIG. 1, a reset voltage is applied between the word line WL and the bit line BL such that a reset current flows through the variable resistor and the temperature of the variable resistor is increased to a melting temperature. Then, the supply of the reset current is rapidly cut off to change the variable resistor into a high-resistance amorphous resistor. When data 0 is stored in the unit memory cell, a set voltage is applied between the word line WL and the bit line BL such that a set current flows through the variable resistor and the temperature of the variable resistor is increased to a crystallization temperature. Then, the supply of the set current is gradually cut off to change the variable resistor into a low-resistance crystalline resistor. In general, the reset voltage is higher than the set voltage, and the reset current is more than the set current.

In order to read data stored in the memory cell, a read voltage is applied between the word line WL and the bit line BL such that a read current flows so as not to change the physical property of the variable resistor, and the read current is compared with a reference current or a reference voltage to discriminate data.

That is, in the next-generation memory device, a write current or a read current flows from the bit line BL to the word line WL through the variable resistor and the switching element, thereby performing a write or read operation.

Figure 2:
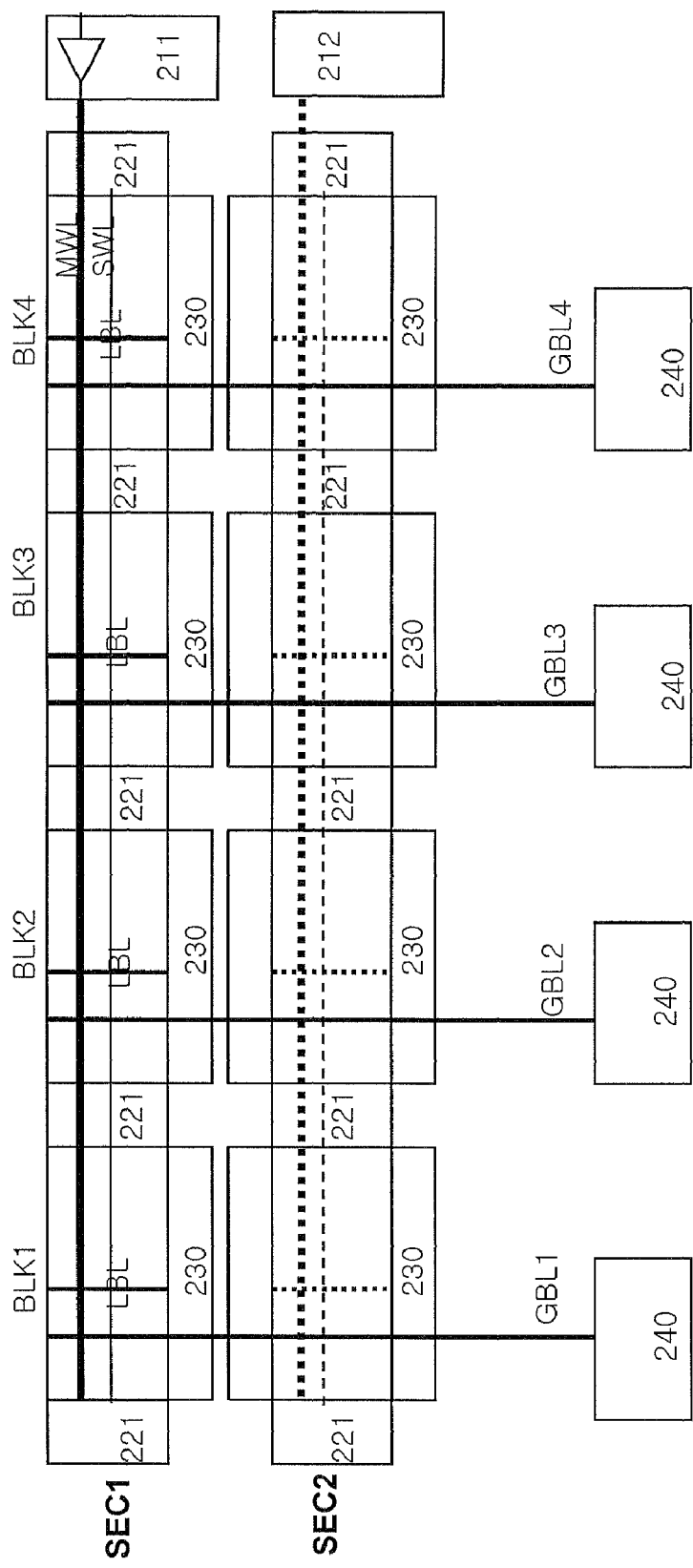
FIG. 2 is a block diagram schematically illustrating a general memory device using the unit memory cells shown in FIG. 1.

FIG. 2 is a block diagram schematically illustrating a general memory device using the unit memory cells shown in FIG. 1.

Referring to FIG. 2, a memory device 200 includes: a plurality of memory sectors SEC1 and SEC2 each having a plurality of memory blocks BLK1 to BLK4; word line drivers 211 and 212 that drive the main word lines WL of the memory sectors SEC1 and SEC2; sub word line drivers 221 that are provided in each of the memory blocks; local bit line selecting units 230 that connect local bit lines LBL of the memory blocks to global bit lines GBL; write drivers that are connected to the global bit lines and supply write data; and sense amplifiers 240 that sense and amplify read data.

During the write operation of the memory device 200, first, the word line driver 211 activates a common main word line MWL connected to all the memory blocks BLK1 to BLK4 of one memory sector SEC1. When the main word line MWL is activated, the sub word line driver 221 in each of the memory blocks BLK1 to BLK4 connects the sub word line SWL to a ground voltage. In addition, the local bit line selecting units 230 of the memory blocks BLK1 to BLK4 in the memory sector SEC1 having the activated main word line connect the local bit lines LBL to the corresponding global bit lines GBL1 to GBL4. Therefore, the write voltage transmitted from the write drivers 240 to the global bit lines GBL1 to GBL4 is transmitted to the local bit lines LBL of the memory blocks BLK1 to BLK4. Then, a voltage difference occurs between the write voltage of the local bit lines LBL and the ground voltage of the sub word line, and a write current flows to the sub word line through the variable resistors of the memory cells connected to the local bit lines LBL1 to LBL4. As a result, the resistance of the variable resistor is increased or decreased.

A plurality of memory cells connected to the sub word line in the memory sector performs a write operation at the same time. Therefore, a large amount of write current flowing through the plurality of memory cells flows to one sub word line, and a sub word line voltage is increased. As a result, the voltage difference between the sub word line and the local bit line is reduced, and a desired amount of write current does not flow through the variable resistor, which results in an error in the write operation.

Similarly, during a read operation, a read current is supplied to one sub word line through a plurality of memory cells connected to the sub word line in the memory sector, and the sub word line voltage is increased. As a result, a desired amount of read current does not flow through the memory cells, which results in an error in the read operation.

Figure 3:
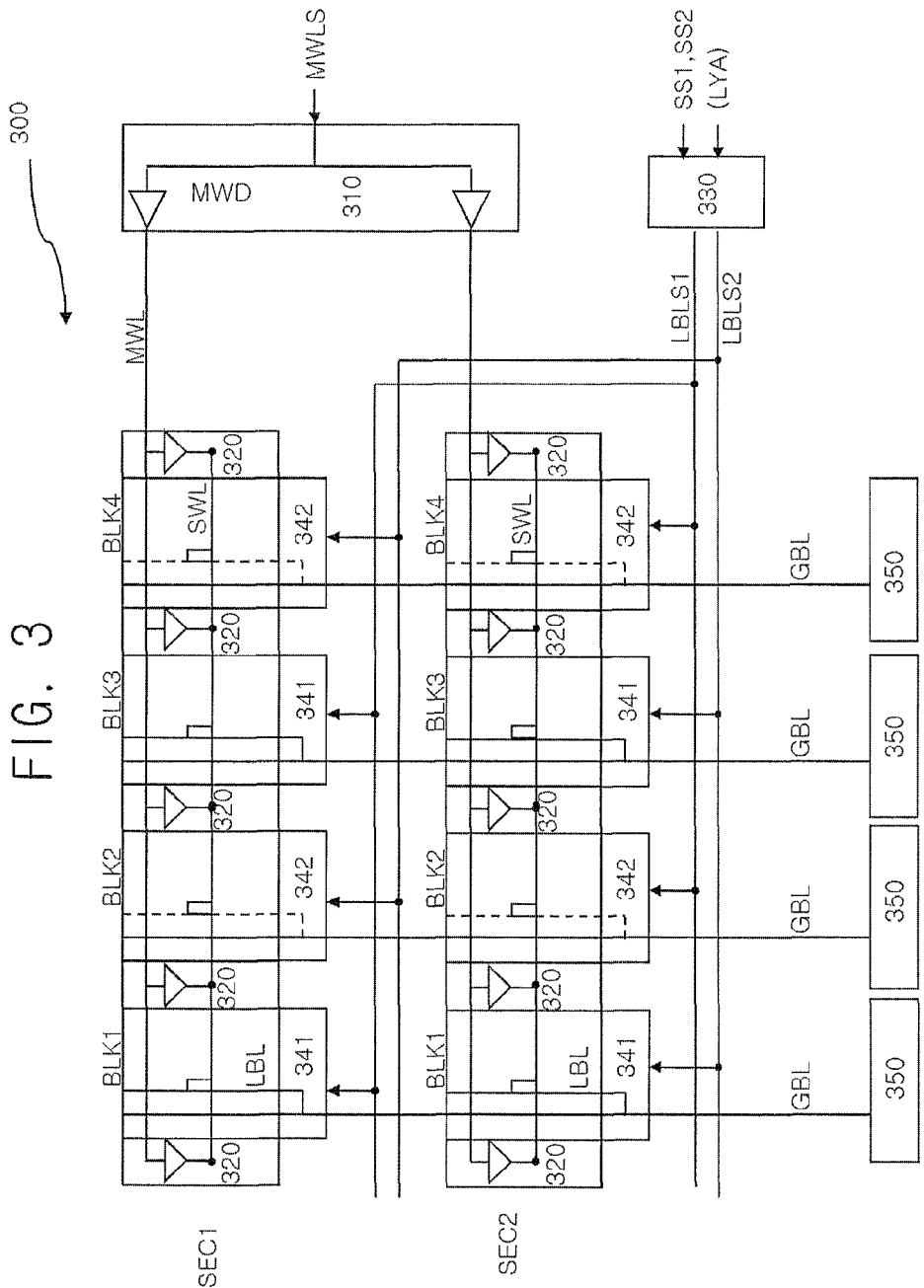
FIG. 3 is a block diagram schematically illustrating an improved memory device using the unit memory cells shown in FIG. 1.

FIG. 3 is a block diagram schematically illustrating an improved memory device using the unit memory cells shown in FIG. 1. FIG. 3 shows a scheme in which only half of the memory blocks in each memory sector are operated to solve the errors in the write operation and the read operation. In this case, the write or read current supplied to one sub word line is reduced, and an increase in the sub word line voltage is prevented.

In FIG. 3, the memory sector is a unit that shares the main word line or the sub word line. In FIG. 3, the local bit line represented by a solid line is connected to the global bit line by a local bit line selecting unit such that data is input or output through the local bit line. The local bit line represented by a dashed line is not connected to the global bit line such that no data is input or output through the local bit line.

Referring to FIG. 3, a memory device 300 includes memory blocks BLK1 to BLK4, memory sectors SEC1 and SEC2, a main word line driver (MWD) 310, sub word line drivers 320, a local bit line selection signal generating unit 330, local bit line selecting units 341 and 342, a write driver, and sense amplifiers 350. In FIG. 3, for clarity of illustration, one main word line is provided in each memory sector. However, a plurality of main word lines may be provided in each memory sector.

Each of the memory blocks BLK1 to BLK4 includes the unit memory cells shown in FIG. 1 in a region in which the sub word line SWL and the local bit line LBL intersect each other. Similarly, for clarity of illustration, in FIG. 3, one sub word line and one local bit line are provided in each memory block. However, a plurality of sub word lines and a plurality of local bit lines may be provided in each memory block.

Each of the memory sectors SEC1 and SEC2 includes four memory blocks BLK1 to BLK4. The main word line MWL in each of the memory sectors SEC1 and SEC2 is commonly connected to all the memory blocks.

The main word line driver 310 activates one of a plurality of main word lines in the memory sectors SEC1 and SEC2 in response to a main word line selection signal MWLS.

The sub word line drivers 320 are disposed between the memory blocks BLK1 to BLK4 and are connected to the common main word line MWL. When the main word line MWL is activated, the sub word line drivers 320 connect the sub word line SWL to a reference voltage. The reference voltage may generally be a ground voltage. In FIG. 3, for clarity of illustration, one sub word line is connected to one main word line. However, it will be understood by those skilled in the art that two or more sub word lines may be connected to one main word line.

The local bit line selection signal generating unit 330 generates first and second local bit line selection signals LBLS1 and LBLS2 in response to memory sector selection signals SS1 and SS2. In the structure in which a plurality of local bit lines is allocated to one global bit line GBL, the local bit line selection signal generating unit generates the first and second local bit line selection signals LBLS1 and LBLS2 in response to local bit line selection information LYA together with the memory sector selection signals.

First local bit line selecting units 341 are provided in odd-numbered memory blocks BLK1 and BLK3 of each memory sector and second local bit line selecting units 342 are provided in even-numbered memory blocks BLK2 and BLK4 of each memory sector. The local bit line selecting units 341 and 342 connect the local bit lines LBL of the memory blocks BLK1 to BLK4 to the corresponding global bit lines GBL in response to the first and second local bit line selection signals LBLS1 and LBLS2.

The first local bit line selecting units 341 in the odd-numbered memory blocks BLK1 and BLK3 of the first memory sector SEC1 and the second local bit line selecting units 342 in the even-numbered memory blocks BLK2 and BLK4 of the second memory sector SEC2 connect the local bit lines LBL of the memory blocks to the corresponding global bit lines GBL in response to the first local bit line selection signal LBLS1.

The second local bit line selecting units 342 in the even-numbered memory blocks BLK2 and BLK4 of the first memory sector SEC1 and the first local bit line selecting units 341 in the odd-numbered memory blocks BLK1 and BLK3 of the second memory sector SEC2 connect the local bit lines LBL of the memory blocks to the corresponding global bit lines GBL in response to the second local bit line selection signal LBLS2.

The write driver and the sense amplifiers 340 supply write data to the global bit lines GBL of the corresponding memory blocks and sense and amplify read data.

In the memory device 300 shown in FIG. 3, only half of the memory blocks in each memory sector participates in the write or read operation. Therefore, the amount of write or read current supplied to one sub word line is reduced, and an increase in sub word line voltage is prevented.

The sub word line drivers 320 are inverter-type drivers and connect the sub word line SWL of each of the memory blocks BLK1 to BLK4 to the ground voltage in response to the main word line signal MWL and the memory sector selection signals SS1 and SS2. When a plurality of sub word lines SWL is allocated to one main word line MWL, the sub word line drivers 320 may require a sub word line selection address in addition to the memory sector selection signals.

The local bit line selection signal generating unit 330 receives the memory sector selection signals SS1 and SS2 and local bit line selection information items LYA and LYAB and activates one of the local bit line selection signals LBLS1<1:2> and LBLS2<1:2>. The local bit line selection information items LYA and LYAB are in a complementary logic state.

The local bit line selecting units 341 and 342 each include an NMOS transistor and are disposed on the upper and lower sides of each memory block. Each of the local bit line selecting units 341 and 342 connects one of the two local bit lines LBL1 and LBL2 in each memory block to the global bit line GBL of the corresponding memory block, in response to one of the local bit line selection signals LBLS1<1:2> and LBLS2<1:2>. That is, the first local bit line selecting unit 341 in the first memory sector and the second local bit line selecting unit 342 in the second memory sector connect one of the local bit lines LBL1 and LBL2 in the corresponding memory block to the global bit line GBL of the memory block in response to the local bit line selection signals LBLS1<1> and LBLS1<2>. In addition, the second local bit line selecting unit 342 in the first memory sector and the first local bit line selecting unit 341 in the second memory sector connect one of the local bit lines LBL1 and LBL2 in the corresponding memory block to the global bit line GBL of the memory block in response to the local bit line selection signals LBLS2<1> and LBLS2<2>. Since the local bit line selecting units 341 and 342 are disposed on the upper and lower sides of each of the memory blocks BLK1 to BLK4, it is possible to prevent the performance from deteriorating due to the load of the local bit line.

Table 1 shows the local bit line selection signals that are activated according to the logic states of the memory sector selection signals SS1 and SS2 and the local bit line selection information items LYA and LYAB and the local bit line connected to the global bit line by the local bit line selecting unit.

TABLE 1

| | SS1 | SS2 | LYA | LYAB | |
|---|---|---|---|---|---|
| LBLS1<1> | H | L | H | L | LBL1 of BLK1 and BLK3 in SEC 1 and LBL1 of BLK2 and BLK4 in SEC 2 are activated |
| LBLS1<2> | H | L | L | H | LBL2 of BLK1 and BLK3 in SEC 1 and LBL2 of BLK2 and BLK4 in SEC 2 are activated |
| LBLS2<1> | L | H | H | L | LBL1 of BLK2 and BLK4 in SEC 1 and LBL1 of BLK1 and BLK3 in SEC 2 are activated |
| LBLS2<2> | L | H | H | L | LBL2 of BLK2 and BLK4 in SEC 1 and LBL2 of BLK1 and BLK3 in SEC 2 are activated |

FIG. 4 is a detailed circuit diagram illustrating the memory device shown in FIG. 3. Referring to FIG. 4, the memory blocks BLK1 to BLK4 have the same structure except that two local bit lines LBL1 and LBL2 are allocated to one global bit line GBL and the local bit line selecting units 341 and 342 are disposed on the upper and lower sides of each of the memory blocks BLK1 to BLK4.

Next, a write operation for the first column of Table 1 will be described in detail with reference to FIGS. 3 and 4.

First, the main word line driver 310 simultaneously activates the main word line MWL of the first memory sector SEC1 and the main word line MWL of the second memory sector SEC2 in response to the main word line selection signal MWLS. The sub word line drivers 320 drive the sub word lines SWL of the memory blocks BLK1 to BLK4 in the memory sectors SEC1 and SEC2 with the ground voltage, in response to the signals from the activated main word lines MWL and the memory sector selection signals SS1 and SS2.

The write drivers 350 apply a write voltage suitable for write data, that is, a reset or set voltage to the global bit lines GBL provided in the memory blocks BLK1 to BLK4.

When the memory sector selection signal SS0 is at a high level and the local bit line selection information LYA is at a high level, the local bit line selection signal generating unit 330 activates only the local bit line selection signal LBLS1<1> at a high level.

The first local bit line selecting units 341 of the odd-numbered memory blocks BLK1 and BLK3 in the first memory sector connect the global bit lines GBL of the corresponding memory blocks to the local bit lines LBL1 of the memory blocks in response to the high-level local bit line selection signal LBLS1<1>. Similarly, the second local bit line selecting units 342 of the even-numbered memory blocks BLK2 and BLK4 in the second memory sector connect the global bit lines GBL of the corresponding memory blocks to the local bit lines LBL1 of the memory blocks.

The write voltage of the global bit line GBL of each memory block is applied to only the local bit line LBL connected to the global bit line GBL by the local bit line selecting unit.

A write current flows to the sub word line through the variable resistor and the switching element of the memory cell due to the difference between the write voltage applied to the local bit line LBL and the voltage of the sub word line. Then, the resistance of the variable resistor is increased or decreased according to the write current. In this way, a write operation is performed.

That is, in the memory device 300, only half of the memory blocks in the memory sectors sharing one word line are operated to perform the write operation.

Similar to the write operation, only half of the memory blocks in each memory sector are operated to perform the read operation.

That is, only half of the memory cells connected to one sub word line are operated during the write or read operation, as compared to the memory device shown in FIG. 2. Therefore, the amount of write or read current flowing to one word line is reduced by half and an increase in word line voltage is prevented. As a result, it is possible to stably perform the write or read operation.

In FIG. 4, two local bit lines are allocated to one global bit line in each memory block, for clarity of illustration. However, four or eight local bit lines may be allocated to one global bit line. In this case, it will be understood by those skilled in the art that the local bit line selection signal generating unit further requires local bit line selection information.

As described above, in the memory device shown in FIG. 3, half of the memory cells connected to one sub word line are operated during the write or read operation, unlike the structure shown in FIG. 2. In this case, it is possible to prevent an increase in word line voltage.

Preferably, a technique capable of appropriately arranging the memory blocks to prevent an increase in word line voltage is required in addition to the above-mentioned scheme. FIGS. 5 to 8 show a memory block arrangement structure in which the memory blocks are alternately arranged to prevent an increase in word line voltage, thereby performing a stable write or read operation.

Next, memory devices according to various example embodiments having different memory block arrangements from that shown in FIG. 3 will be described with reference to FIGS. 5 to 9.

Figure 6:
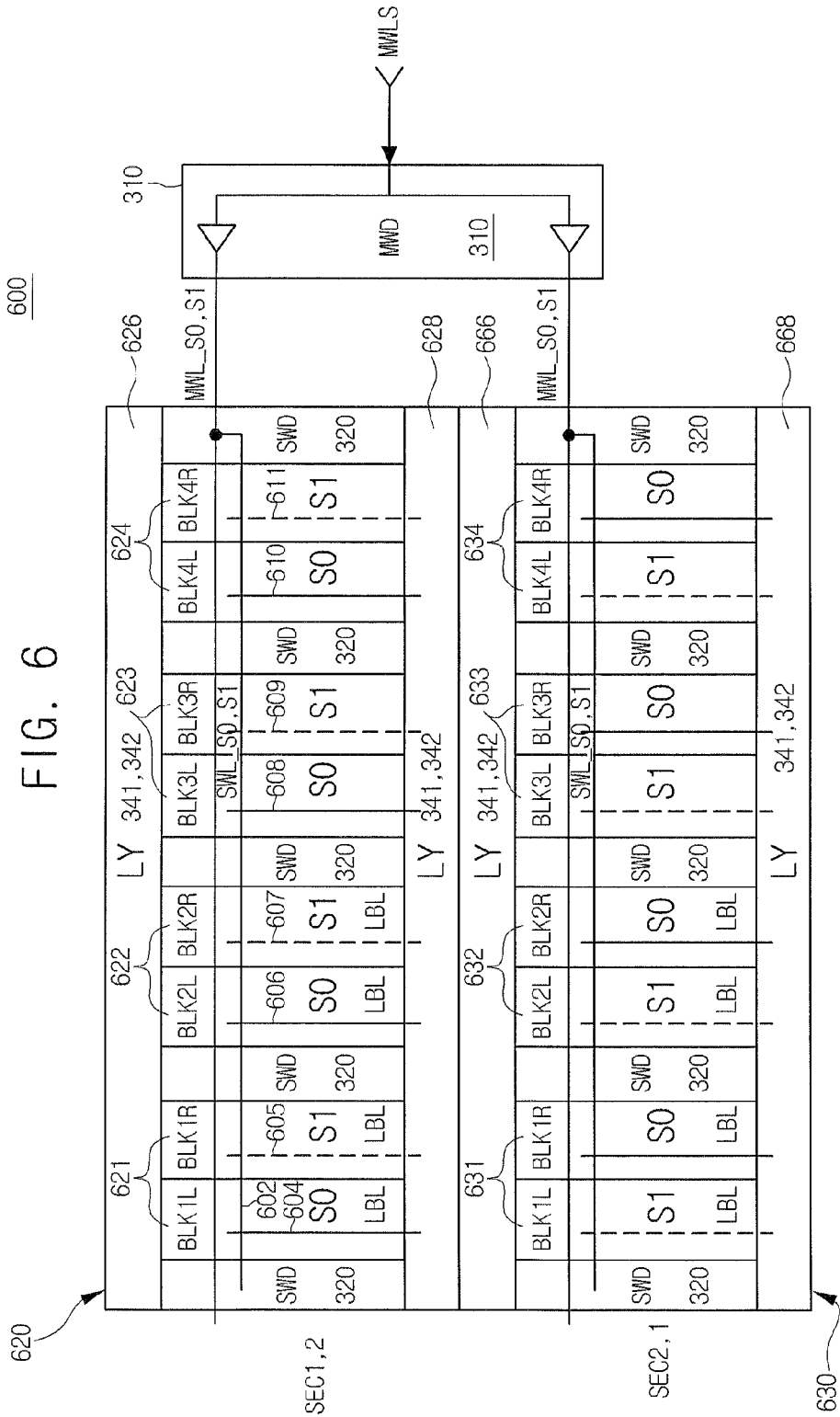
FIG. 6 is a block diagram schematically illustrating a memory device according to a modification of the example embodiment shown in FIG. 5.

First, FIG. 5 is a block diagram schematically illustrating a memory device having a vertical alternating block arrangement structure according to an example embodiment of the invention, and FIG. 6 is a block diagram schematically illustrating a memory device according to a modification of the example embodiment shown in FIG. 5.

Figure 7:
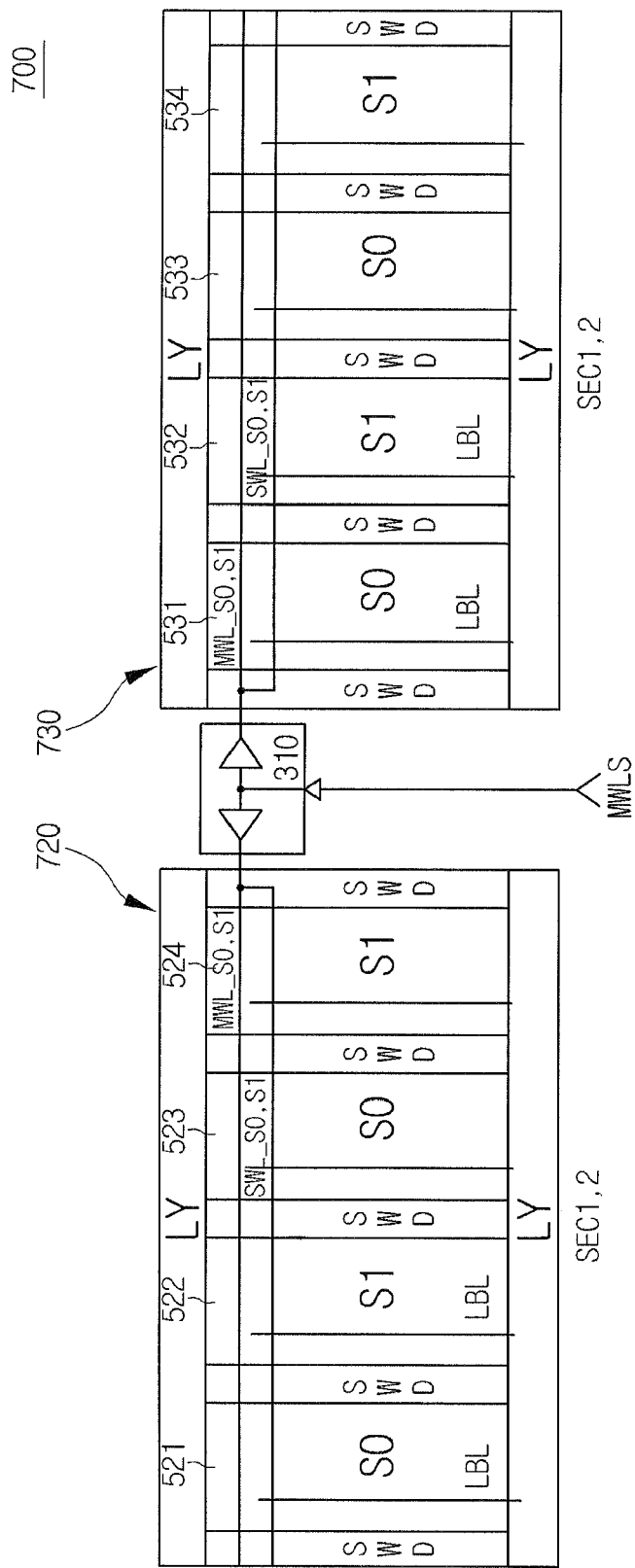
FIG. 7 is a block diagram schematically illustrating a memory device having a horizontal alternating block arrangement structure according to another example embodiment of the invention.
Figure 8:
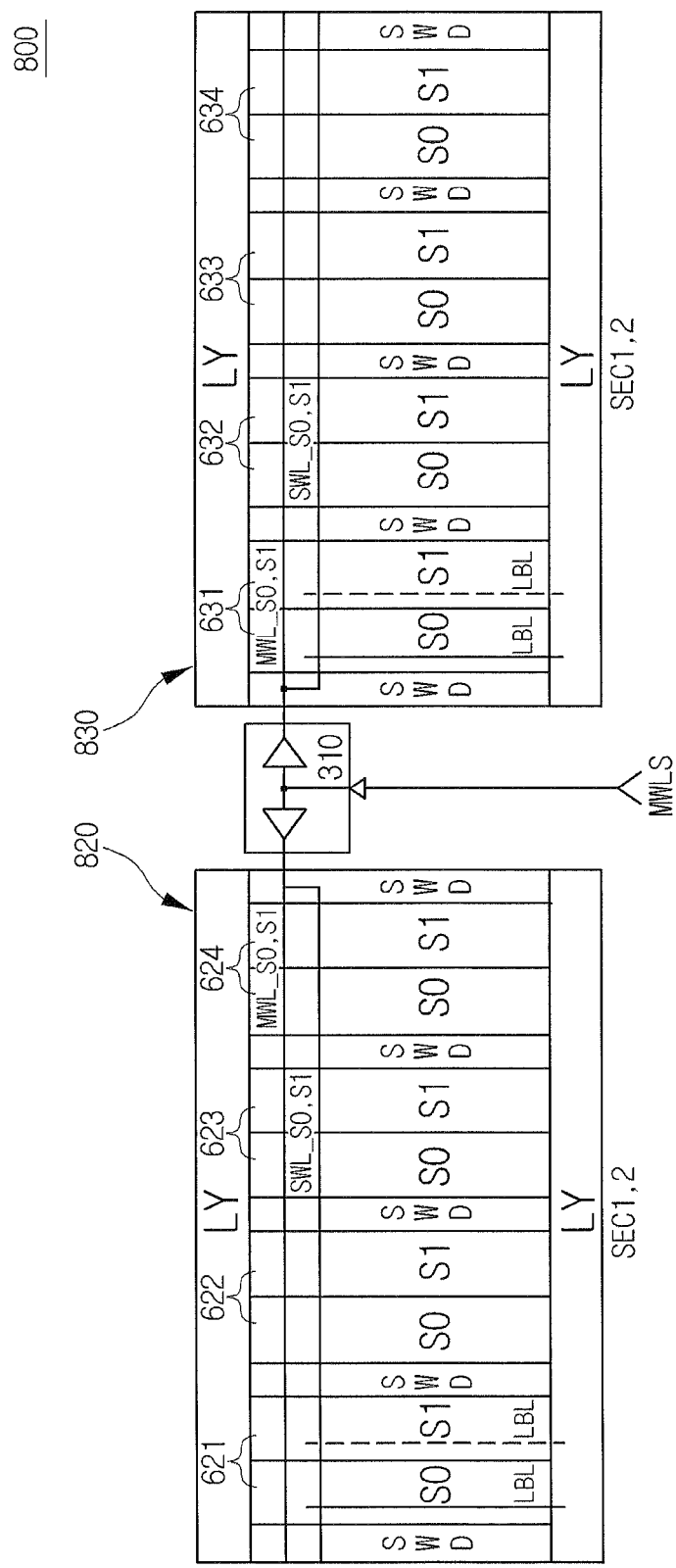
FIG. 8 is a block diagram schematically illustrating a memory device according to a modification of the example embodiment shown in FIG. 7.
Figure 9:
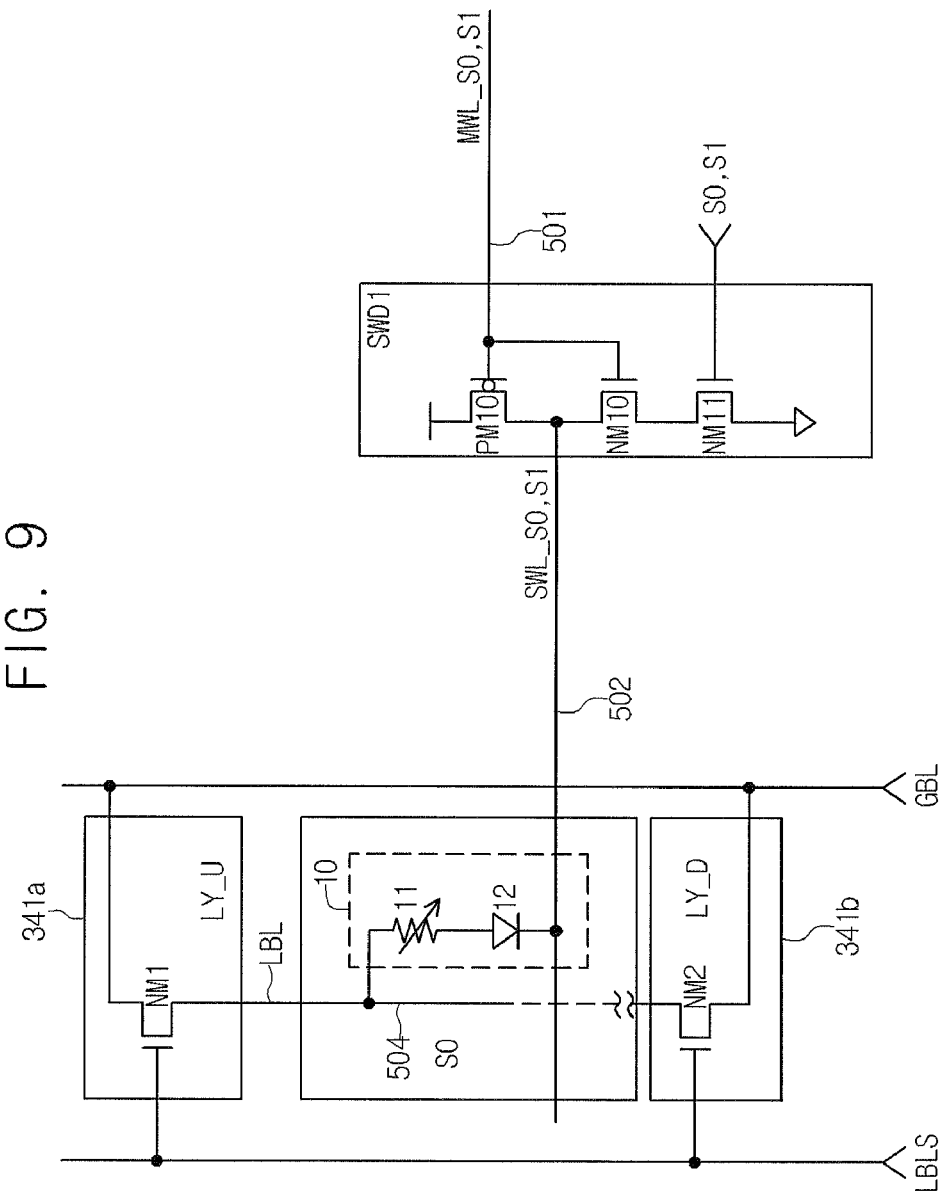
FIG. 9 is a circuit diagram illustrating the connection of a sub word line and a local bit line shown in FIGS. 5 to 8 to the memory cell.

FIG. 7 is a block diagram schematically illustrating a memory device having a vertical alternating block arrangement structure according to another example embodiment of the invention, and FIG. 8 is a block diagram schematically illustrating a memory device according to a modification of the example embodiment shown in FIG. 7. FIG. 9 is a circuit diagram illustrating the connection of the sub word line and the local bit line shown in FIGS. 5 to 8 to the memory cell.

First, FIG. 5 shows an example of the memory device having a vertical alternating block arrangement structure. In the memory device shown in FIG. 5, the memory blocks BLK1, BLK2, BLK3, and BLK4 belong to different memory sectors and are alternately arranged so as to be adjacent to each other in a memory bank including the memory sectors, as compared to the arrangement structure of the memory blocks shown in FIG. 3. In FIG. 5, a first mixing memory sector unit 520 and a second mixing memory sector unit 530 include a plurality of memory blocks 521, 522, 523, 524, 531, 532, 533, and 534.

The memory blocks 521, 523, 532, and 534 denoted by reference numeral S0 belong to the first memory sector SEC1, and the memory blocks 522, 524, 531, 533 denoted by reference numeral S1 belong to the second memory sector SEC2. The first memory sector and the second memory sector form a portion of the memory bank.

In FIG. 5, for convenience of explanation, the memory blocks 521, 523, 532, and 534 arranged with a gap therebetween in the memory sectors are referred to as first group memory blocks, and the memory blocks 522, 524, 531, and 533 arranged with a gap therebetween in the memory sectors are referred to as second group memory blocks.

In FIG. 5, a line selecting unit includes a main word line driver 310, sub word line drivers SWD, a local bit line selection signal generating unit (denoted by reference numeral 330 in FIG. 3), and local bit line selecting units LY. The line selecting unit simultaneously selects the word lines (SWL_S0,S1 in FIG. 5) of the plurality of memory blocks in an access operation mode, and simultaneously selects the bit lines of the memory blocks (for example, the blocks S0 or the blocks S1) belonging to the same memory sector, among the plurality of memory blocks S0 and S1.

The main word line driver 310 activates one main word line MWL_S0,S1 of each of the first and second mixing memory sector units 520 and 530, in response to the main word line selection signal MWLS.

The sub word line drivers SWD are disposed between the memory blocks and activate the sub word line SWL_S0,S1 of each memory block in response to the signal of the activated main word line MWL_S0,S1. When the sub word line SWL_S0,S1 is activated by the signal of the main word line MWL_S0,S1, the sub word line SWL_S0,S1 is connected to a reference voltage, such as a ground voltage.

In the drawings, for clarity of illustration, one sub word line SWL_S0,S1 is connected to one main word line MWL_S0, S1. However, it will be understood by those skilled in the art that two or more sub word lines SWL_S0,S1 may be connected to one main word line.

The local bit line selecting unit LY is provided in each memory block and connects the local bit line LBL of the memory block to the corresponding global bit line (GBL in FIG. 3) in response to the local bit line selection signal. In the drawings, the local bit line selecting units LY are disposed on the upper and lower sides of each of the memory blocks BLK1 to BLK4 in order to prevent the performance from deteriorating due to the load of the local bit line.

Although not shown in FIG. 5, the local bit line selecting unit LY is connected to the local bit line selection signal generating unit 330 shown in FIG. 3. The local bit line selection signal generating unit 330 receives the memory sector selection signals SS1 and SS2 and the local bit line selection information items LYA and LYAB and generates the local bit line selection signals LBLS1 and LBLS2.

In FIG. 5, the first mixing memory sector unit 520 and the second mixing memory sector unit 530 indicate memory capacity units sharing the main word line MWL_S0,S1 or the sub word line SWL_S0,S1 and belong to a memory bank of the memory cell array. In FIG. 5, the local bit line LBL represented by a solid line indicates that data is input or output by the selection operation of the local bit line selecting unit LY, and the local bit line represented by a dashed line indicates that no data is input or output.

In FIG. 5, similar to FIG. 3, for clarity of illustration, one sub word line and one local bit line are provided in each memory block. However, a plurality of sub word lines and a plurality of local bit lines may be provided in each memory block.

As shown in FIG. 5, in the vertical alternating block arrangement structure in which the memory blocks BLK1, BLK2, BLK3, and BLK4 belong to different memory sectors and are alternately arranged so as to be adjacent to each other in the memory bank including the memory sectors, only half of the memory blocks of a memory device 500 shown in FIG. 5 participate in the write or read operation. Therefore, the amount of write or read current flowing to one sub word line is reduced, and an increase in sub word line voltage is prevented.

That is, as shown in FIG. 5, the first group memory blocks belong to the first memory sector of the memory bank and are arranged with a gap therebetween. The second group memory blocks belong to the second memory sector of the memory bank and are arranged between the first group memory blocks. In the access operation mode, the word lines of the first and second group memory blocks are simultaneously activated, and the bit lines of the first group memory blocks or the second group memory blocks are simultaneously activated. In this way, the amount of current flowing to the activated word line in the memory sector is minimized, and an increase in word line voltage is prevented. As a result, it is possible to stably perform a write or read operation.

As shown in FIG. 6, in a first mixing memory sector unit 620, sub memory blocks BLK1L, BLK2L, BLK3L, and BLK4L that belong to the first memory sector SEC1 of a memory bank are arranged with a gap therebetween. In addition, in a second mixing memory sector unit 630, sub memory blocks BLK1R, BLK2R, BLK3R, and BLK4R that belong to the first memory sector SEC1 of the memory bank are arranged with a gap therebetween.

In the first mixing memory sector unit 620, sub memory blocks BLK1R, BLK2R, BLK3R, and BLK4R that belong to the second memory sector SEC2 of the memory bank are arranged with a gap therebetween. In the second mixing memory sector unit 630, sub memory blocks BLK1L, BLK2L, BLK3L, and BLK4L that belong to the second memory sector SEC2 of the memory bank are arranged with a gap therebetween.

Similar to FIG. 5, in FIG. 6, in the access operation mode, the line selecting unit simultaneously activates the word lines of the first and second group memory blocks S0 and S1 and simultaneously activates the bit lines of the first group memory blocks S0 or the second group memory blocks S1. In this way, the amount of current flowing to the word line of the activated memory sector is reduced.

As such, the structure and operation shown in FIG. 6 are substantially the same as those shown in FIG. 5 except that the memory blocks (or the sub memory blocks) are alternately arranged.

In the structures shown in FIGS. 5 and 6, the first and second memory sectors are symmetrically arranged with respect to the local bit line selecting unit LY.

However, in the structures shown in FIGS. 7 and 8, the first and second memory sectors are symmetrically arranged with respect to the main word line driver 310.

That is, a memory device 700 shown in FIG. 7 has a structure in which the first mixing memory sector unit 520 and the second mixing memory sector unit 530 shown in FIG. 5 are symmetrically arranged in the horizontal direction with respect to the main word line driver 310. This arrangement structure can provide special advantages when it is difficult to achieve the arrangement structure shown in FIG. 5.

A memory device 800 shown in FIG. 8 has a structure in which the first mixing memory sector unit 620 and the second mixing memory sector unit 630 shown in FIG. 6 are symmetrically arranged in the horizontal direction with respect to the main word line driver 310. This arrangement structure can provide special advantages when it is difficult to achieve the arrangement structure shown in FIG. 6.

As described with reference to FIGS. 5 to 8, according to the example embodiments of the invention in which the memory blocks belonging to different sectors are alternately arranged, the amount of current flowing to the activated word line in the memory sector is significantly less than that in the structure shown in FIG. 2. Therefore, it is possible to effectively prevent an increase in word line voltage.

Next, the detailed connection structure of the memory cell shown in FIGS. 5 to 8 will be described with reference to FIG. 9.

FIG. 9 is a diagram illustrating the connection of the sub word line and the local bit line shown in FIGS. 5 to 8 to the memory cell.

The memory cell 10 that may include the variable resistor 11 and the diode 12 is connected to a local bit line 504 and a sub word line 502. An upper local bit line selecting unit 341a of the memory block S0 is composed of an NMOS transistor NM1. A lower local bit line selecting unit 341b of the memory block S0 is composed of an NMOS transistor NM2.

When a high-level local bit line selection signal LBLS is applied to the gates of the NMOS transistors NM1 and NM2, the local bit line LBL is connected to the global bit line GBL.

A sub word line driver SWD1 includes a PMOS transistor PM10 and NMOS transistors NM10 and NM11. When a memory sector selection signal S0,S1 is at a high level and the signal of the main word line MWL_S0,S1 is activated at a high level, the sub word line SWL_S0,S1 is connected to a ground voltage.

While the example embodiments have been shown and described with reference to the drawings, it will be understood by one of ordinary skill in the art that various changes in form and details may be made therein without departing from the spirit and scope of the example embodiments as defined by the following claims. For example, the alternating arrangement structure of the memory blocks may be changed without departing from the technical scope and spirit of the invention. In the above-described example embodiments, the variable resistance memory devices, such as a PRAM, an RRAM, and an MRAM are given as an example. However, the invention can be applied to other similar memory devices.

What is claimed is:

1. A variable resistance semiconductor memory device comprising:
   a plurality of memory blocks belonging to different memory sectors and alternately arranged in a memory bank including the memory sectors so as to be adjacent to each other; and
   a line selecting unit simultaneously selecting word lines of the plurality of memory blocks and simultaneously selecting bit lines of the memory blocks belonging to the same memory sector among the plurality of memory blocks in an access operation mode.

2. A variable resistance semiconductor memory device comprising:
   first group memory blocks belonging to a first memory sector of a memory bank and arranged with a gap therebetween;
   second group memory blocks belonging to a second memory sector of the memory bank and arranged between the first group memory blocks; and
   a line selecting unit simultaneously activating word lines of the first and second group memory blocks and simultaneously activating bit lines of the first group memory blocks or the second group memory blocks in an access operation mode.

3. The variable resistance semiconductor memory device of claim 2, wherein the word line is a sub word line connected to a main word line.

4. The variable resistance semiconductor memory device of claim 3, wherein the bit line is a local bit line connected to a global bit line.

5. The variable resistance semiconductor memory device of claim 4, wherein the first and second group memory blocks are arranged in each of two sectors.

6. The variable resistance semiconductor memory device of claim 5, wherein each of the memory blocks includes a memory cell having a variable resistor in a region in which the sub word line and the local bit line intersect each other.

7. The variable resistance semiconductor memory device of claim 6,
   wherein the line selecting unit includes:
   a main word line driver activating one main word line in each of the first and second memory sectors in response to a main word line selection signal;
   sub word line drivers provided between the memory blocks and activating the sub word lines of the memory blocks in response to the activated main word line signal;
   a local bit line selection signal generating unit generating local bit line selection signals in response to a memory sector selection signal; and
   local bit line selecting units allocated to each of the memory blocks and connecting the local bit lines of the memory blocks to the corresponding global bit lines in response to the local bit line selection signals.

8. The variable resistance semiconductor memory device of claim 7, wherein the first and second memory sectors are symmetrically arranged with respect to the main word line driver or the local bit line selecting unit.

9. A variable resistance semiconductor memory device comprising:
   first group memory blocks belonging to a first memory sector of a memory bank and including sub memory blocks that are arranged with a gap therebetween;
   second group memory blocks belonging to a second memory sector of the memory bank and arranged between the sub memory blocks of the first group memory blocks; and
   a line selecting unit simultaneously activating word lines of the first and second group memory blocks and simultaneously activating bit lines of the first group memory blocks or the second group memory blocks in an access operation mode.

10. The variable resistance semiconductor memory device of claim 9, wherein the first and second memory sectors are symmetrically arranged with respect to a main word line driver or a local bit line selecting unit.

* * * * *